United States Patent [19]

Nicholson

[11] 4,307,348

[45] Dec. 22, 1981

[54] AUTOMATIC GAIN CONTROL CIRCUIT

[75] Inventor: Robert D. Nicholson, Holyport, nr. Maidenhead, England

[73] Assignee: Racal-Dana Instruments Limited, Bracknell, England

[21] Appl. No.: 112,734

[22] Filed: Jan. 17, 1980

[30] Foreign Application Priority Data

Jan. 17, 1979 [GB] United Kingdom ............... 1643/79

[51] Int. Cl.$^3$ ............................................... H03G 3/20
[52] U.S. Cl. ................................... 330/134; 330/138; 330/279
[58] Field of Search ............... 330/133, 134, 141, 144, 330/145, 138, 254, 279, 280, 284

[56] References Cited

FOREIGN PATENT DOCUMENTS 951058 3/1964 United Kingdom ............... 330/134

*Primary Examiner*—James B. Mullins
*Attorney, Agent, or Firm*—Leydig, Voit, Osann, Mayer & Holt, Ltd.

[57] ABSTRACT

An A.G.C. circuit is disclosed having two modulators connected in series to modulate an input signal and an amplifier for amplifying the output of the second modulator and applying it to an output terminal. A detector detects the output of the amplifier and an integrator compares the detected level with a reference so as to produce a control signal dependent on the error. The control signal is applied to the first modulator through an impedance path having an impedance which decreases with increasing frequency, and is applied to the same modulator through an impedance path having an impedance which increases with increasing frequency. In this way, the first modulator performs modulation primarily dependent on the A.C. component of the control signal and a second modulator performs modulation primarily dependent on its D.C. components of the control signal. Therefore, changes in the gain of the amplifier, or in the level of the input signal, which tend to alter the upper limit of the loop bandwidth of the circuit, are substantially offset by the effect of the resultant change in the gain of the second modulator.

7 Claims, 4 Drawing Figures

AUTOMATIC GAIN CONTROL CIRCUIT

BACKGROUND OF THE INVENTION

The invention relates to electrical circuit arrangements. One example of an electrical circuit arrangement to which the invention relates is an automatic gain control (AGC) circuit arrangement.

Various AGC circuit arrangements are known. However, a problem which can arise with known AGC circuit arrangements is that their bandwidth varies with gain and thus with the level of output signal for a given input. Where a wide loop bandwidth is required (e.g. to handle amplitude modulation up to 20 KHz or more), this variation of bandwidth can give rise to instability.

An object of the invention is an improved automatic gain control circuit arrangement.

A more specific object of the invention is an automatic gain control circuit arrangement having a bandwidth which is not unduly affected by the level of the input signal.

BRIEF SUMMARY OF THE INVENTION

According to the invention, there is provided an automatic gain control circuit arrangement for producing an output signal which is dependent on an input signal and whose mean level has a desired value, comprising a signal path having an input for receiving the input signal and an output at which is produced the output signal, the signal path including control means controllable to vary the level of the signal in the signal path and amplifying means for amplifying the signal in the signal path, the circuit arrangement also including detecting means connected to sense the level of the signal in the signal path after its level has been varied by the control means and amplified by the amplifying means, and operative in response to variations of the sensed level from the desired value to produce a control signal dependent on the variations and which adjusts the control means in a sense such that it offsets the said variations, the control means comprising one part primarily responsive to the alternating component of the control signal and another part primarily responsive to the D.C. component of the control signal whereby changes in the gain of the amplifying means or in the level of the input signal which tend to alter the upper limit of the loop bandwidth of the circuit arrangement are substantially offset by the effect of the resultant change in the gain of the said other part of the control means.

According to the invention, there is also provided an automatic gain control circuit arrangement, comprising means for receiving an input signal, first modulating means connected to modulate the level of the input signal, second modulating means connected to modulate the output of the first modulating means, an amplifier for amplifying the output of the second modulating means and for applying it to an output terminal, a detector for detecting the level of the output of the amplifier, means operative to compare the detected level with a reference dependent on a desired value of the mean level of the signal produced at the output terminal whereby to produce a control signal dependent on the difference between the actual level of the output of the amplifier and the said desired value, the first and second frequency-dependent impedance paths of applying the control signal to the first and second modulating means respectively, one impedance path having an impedance which decreases with increasing frequency and the other impedance path having an impedance which increases with increasing frequency, whereby one modulating means performs modulation primarily dependent on the value of the alternating component of the control signal and the other modulating means performs modulation primarily dependent on the D.C. component of the control signal, so that the upper limit of the bandwidth of the circuit arrangement is substantially unaffected by changes in the gain of the amplifier or in the mean level of the input signal.

DESCRIPTION OF THE DRAWINGS

AGC circuit arrangements embodying the invention will now be described by way of example only and with reference to the accompanying diagrammatic drawings in which.

DESCRIPTION OF PREFERRED EMBODIMENTS

Figure 1:
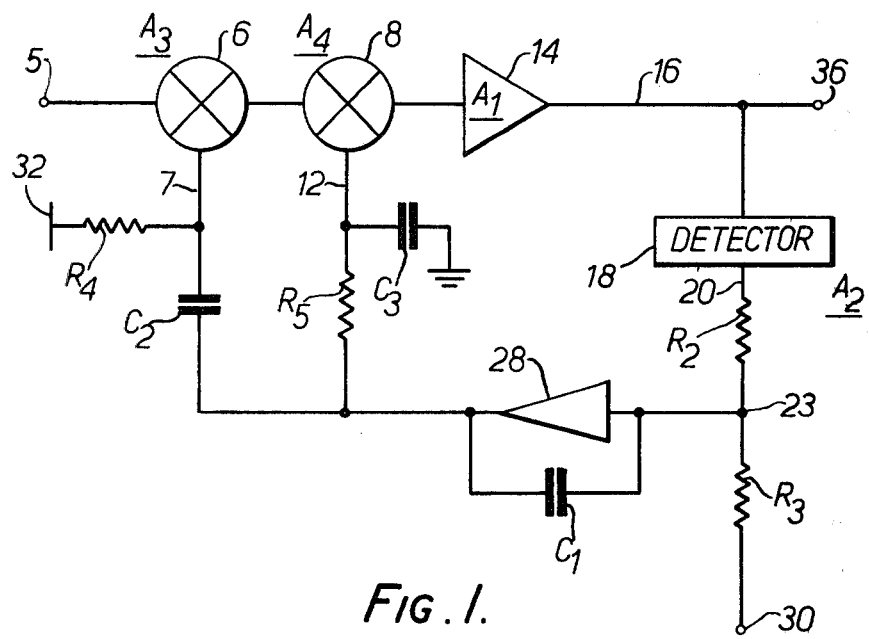
FIG. 1 is a circuit diagram of one of the AGC circuit arrangements.

In the following description, direct voltage signal components or constant amplitude signals are represented by upper case "V", together with a distinguishing subscript, while varying amplitude components of such direct current or constant amplitude signals are represented by a lower case "v" together with a distinguishing subscript.

The AGC circuit arrangement (FIG. 1) has an input terminal 5 at which is received the input signal $S_i = V_i + v_i$. The signal is passed to one terminal of a first modulator 6 which receives a modulating signal $S_{c1}$ on a second input line 7. The output $V_6$ of the modulator 6 is passed to the first input of a second modulator 8 which receives a modulating signal $S_{c2}$ on a second input line 12.

The output $V_8$ of the second modulator 8 is passed through an amplifier 14 having an output line 16. The level of the signal $V_o$ on the line 16 is sensed by a detector 18 which produces a resultant output on a line 20 which is applied through a resistor R2 to a point 23. Also applied to the point 23 is a reference signal $S_r$ via a terminal 30 and a resistor R3. Therefore, the integrator input receives the algebraic sum of the signals applied to the point 23 through the resistors R2 and R3. Integrator 28 has an integrating capacitor C1 connected across it.

The output $S_c$ of the integrator 28 provides the modulating signals $S_{c1}$ and $S_{c2}$ for the modulators 6 and 8. The signal $S_{c1}$ is produced via a capacitor C2 which is shunted by a resistor R4 connected to a bias supply (not shown) by a terminal 32. The signal $S_{c2}$ is produced via a resistor R5 which is shunted to ground by a capacitor C3. The result, therefore, is that the modulator 6 is responsive only to the alternating components of the signal $S_c$, while the modulator 8 is responsive only to the D.C. and low frequency components of the signal $S_c$.

The output signal, $V_o$, of the circuit arrangement is taken from a terminal 36 connected to the line 16 from the amplifier 14.

The AGC circuit of FIG. 1 will now be analysed. In the analysis which follows, the following terms will be used (in addition to those mentioned above):

$$S_r = V_r + v_r;$$

gain of amplifier 14 is $A_1$;
gain of the detector 18 is $A_2$;

$$S_c = V_c + v_c$$

$$S_{c1} = V_{c1} + v_{c1}$$

(where $V_{c1}$ is the bias voltage applied via resistor $R_4$);

$$S_{c2} = V_{c2} + v_{c2};$$

the gain of modulator 6 $(v_6/v_i) = A_3$;
the gain of modulator 8 $(v_8/v_6) = A_4$; and
the values of the capacitors and resistors are taken to be represented by the references identifying them in FIG. 1.

Considering modulator 6, $$v_6 = A_3 \cdot v_i$$

but $A_3 = K_1 \cdot V_{c1}$ where $K_1$ is the transfer characteristic of the modulator.
Therefore, $$\begin{aligned} V_6 &= K_1 \cdot V_{c1} \cdot v_i \quad (1) \\ &= K_1 \cdot V_{c1} \cdot \Delta V_i \\ &= K_1 \cdot V_i \cdot \Delta V_{c1} \\ &= K_1 \cdot V_i \cdot V_{c1} \end{aligned}$$

This assumes $V_i$ is constant ($v_i = 0$).

Considering modulator 8, by analogy with Equation (1), $$v_8 = K_2 \cdot V_6 \cdot v_{c2} \quad (2)$$

where $K_2$ is the transfer characteristic of modulator 8. But this assumes $V_6$ is constant and is the variation due to $V_{c2}$. With $V_{c2}$ constant ($v_{c2} = 0$) and $V_6$ varying, $$v_8 = A_4 \cdot v_6 \quad (3)$$

Therefore, combining Equations (2) and (3), $$v_8 = A_4 \cdot v_6 + K_2 \cdot V_6 \cdot v_{c2} \quad (4)$$

Now, $$v_c = -\frac{v_o \cdot A_2}{s \cdot C_1 \cdot R_2} \quad (5)$$

$$v_{c1} = \frac{s \cdot C_2 \cdot R_4}{1 + s \cdot C_2 \cdot R_4} \cdot v_c \quad (6)$$

and $$v_{c2} = \frac{v_c}{1 + s \cdot C_3 \cdot R_5} \quad (7)$$

Initially, it has been assumed that $V_i$ is constant. Therefore $v_i = 0$. Under these conditions (and assuming $V_r$ is constant, $v_r = 0$), the total loop gain $G_1$ is $$G_1 = -A_1 \cdot A_2 \cdot \frac{1}{s \cdot C_1 \cdot R_2} \cdot \frac{v_8}{v_c} \quad (8)$$

Substituting from Equations (1), (4) (6) and (7) into Equations (8), and assuming that $C_2 = C_3 = C$ and $R_4 = R_5 = R$, $$G_1 = -A_1 \left[ \frac{A_2}{s \cdot C_1 \cdot R_2} \cdot \left( \frac{A_4 \cdot v_6 + K_2 \cdot V_6 \cdot v_{c2}}{v_c} \right) \right]$$

$$= -A_1 \left[ \frac{A_2}{s \cdot C_1 \cdot R_2} \cdot \left( \frac{A_4 \cdot K_1 \cdot V_i \cdot v_{c1} + K_2 \cdot V_6 \cdot v_{c2}}{v_c} \right) \right]$$

$$= -A_1 \left[ \frac{A_2}{v_c \cdot s \cdot C_1 \cdot R_2} \cdot \left( \frac{A_4 \cdot K_1 \cdot V_i \cdot s \cdot C \cdot R \cdot v_c}{1 + s \cdot C \cdot R} + \frac{K_2 \cdot V_6 \cdot v_c}{1 + s \cdot C \cdot R} \right) \right]$$

$$G_1 = -A_1 \left[ \frac{A_2}{s \cdot C_1 \cdot R_2} \cdot (A_4 \cdot K_1 \cdot V_i \cdot s \cdot C \cdot R + K_2 \cdot V_6) \right] \cdot \frac{1}{1 + s \cdot C \cdot R}$$

$$= \frac{-A_1 \cdot A_2}{s \cdot C_1 \cdot R_2} [A_4 \cdot K_1 \cdot v_i \cdot s \cdot C \cdot R + K_2 \cdot V_6] \cdot \frac{1}{1 + sC \cdot R}$$

$$= \frac{-A_1 \cdot A_2 \cdot K_2 \cdot V_6 \left(1 + \frac{A_4 \cdot s \cdot C \cdot R \cdot K_1 \cdot V_i}{K_2 \cdot V_6}\right)}{s \cdot C_1 \cdot R_2 (1 + s \cdot C \cdot R)}$$

Hence, $G_1 = \dfrac{1 + s \cdot T_1}{s \cdot T_3 (1 + s \cdot T_o)}$ \quad (9)

where $T_o = CR$, \quad (10)

$$T_1 = \frac{C \cdot R \cdot A_4 \cdot K_1 \cdot V_i}{K_2 \cdot V_6}, \text{ and} \quad (11)$$

$$T_3 = \frac{C_1 \cdot R_2}{A_1 \cdot A_2 \cdot K_2 \cdot V_6} \quad (12)$$

Figure 2:
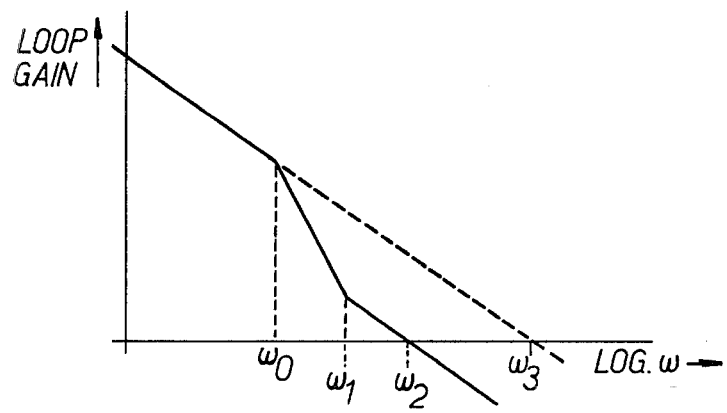
FIG. 2 is a Bode plot of the circuit arrangement of FIG. 1.

FIG. 2 shows a Bode plot (loop gain against the logarithm of angular frequency) of Equation (9) where the angular frequencies $\omega_o$, $\omega_1$ and $\omega_3$ correspond respectively to the time constants $T_o$, $T_1$ and $T_3$ defined above. $\omega_2$ is the angular frequency at the upper end of the frequency band of the circuit.

By geometry from FIG. 2, $$(\omega_3/\omega_2) = (\omega_1/\omega_o)$$

Therefore, $$(T_2/T_3) = (T_o/T_1)$$

Thus, $$T_2 = (T_o \cdot T_3 / T_1) \quad (13)$$

Substituting from Equations (10), (11) and (12) in Equations (13), $$T_2 = \frac{C \cdot R \cdot C_1 \cdot R_2}{A_1 \cdot A_2 \cdot K_2 \cdot V_6} \cdot \frac{K_2 \cdot V_6}{C \cdot R \cdot A_4 \cdot K_1 \cdot V_i} \quad (14)$$

$$= \frac{C_1 \cdot R_2}{A_1 \cdot A_2 \cdot A_4 \cdot K_1 \cdot V_i}$$

-continued or $$\omega_2 = \frac{A_1 \cdot A_2 \cdot A_4 \cdot K_1 \cdot V_i}{C_1 \cdot R_2}$$

Equation (14) therefore shows the factors which affect $\omega_2$ that is, the factors which affect the upper limit of the bandwidth of the circuit. These factors are $A_1$, $A_2$, $A_4$, $K_1$ and $V_i$.

The operation of the circuit arrangement will be considered assuming that it is desired to keep $V_o$ constant, and that this will be done by keeping $V_r$ constant.

If, now, there is an increase in $A_1$, then, due to the D.C. feedback through the modulator 8, $A_4$ will be reduced so as to hold $V_o$ constant. Therefore, for a given $V_o$, $A_1 \cdot A_4$ is constant.

If now there is an increase in $V_i$, then again, due to the D.C. feedback path through modulator 8, $A_4$ will be reduced to keep $V_o$ constant. Therefore, for a given $V_o$, $A_4 \cdot V_i$ is constant.

Therefore, summarising, for a given $V_o$, $A_1 \cdot A_4 \cdot V_i$ is constant.

In addition, $A_2$, the gain of the detector 18, must be constant (otherwise, the circuit arrangement will not be able to maintain $V_o$ constant).

Therefore, for a given $V_o$, $$\omega_2 = Z \cdot K_1,$$

where $Z = \dfrac{A_1 \cdot A_2 \cdot A_4 \cdot V_i}{C_1 \cdot R_2}$ = constant  (15)

For small values of control signal $v_{c1}$, the factor $K_1$ for the modulator 6 should be constant.

Therefore, overall, $\omega_2$ is constant.

The foregoing assumes that $V_o$ is constant. However it may be desired to operate the circuit arrangement so that $V_o$ varies (by a controlled amount). This may be done by varying the reference signal $V_r$. However, a change in $V_r$ will produce a change (in the opposite sense) in $V_o$. This is achieved by the variation of $A_4$ by means of the signal $V_{c2}$. Therefore, Equation (15) no longer applies, and thus $\omega_2$ is not constant if $V_o$ varies.

However, Equation (15) shows that if $A_2$ can be made inversely proportional to $V_o$, then $A_2 \cdot A_4$ will be constant as $V_o$ varies. In such a case, $$\frac{A_1 \cdot A_2 \cdot A_4 \cdot V_i}{C_1 \cdot R_2}$$

will be constant for all values of $V_o$, and so, therefore, will $\omega_2$.

Figure 3:
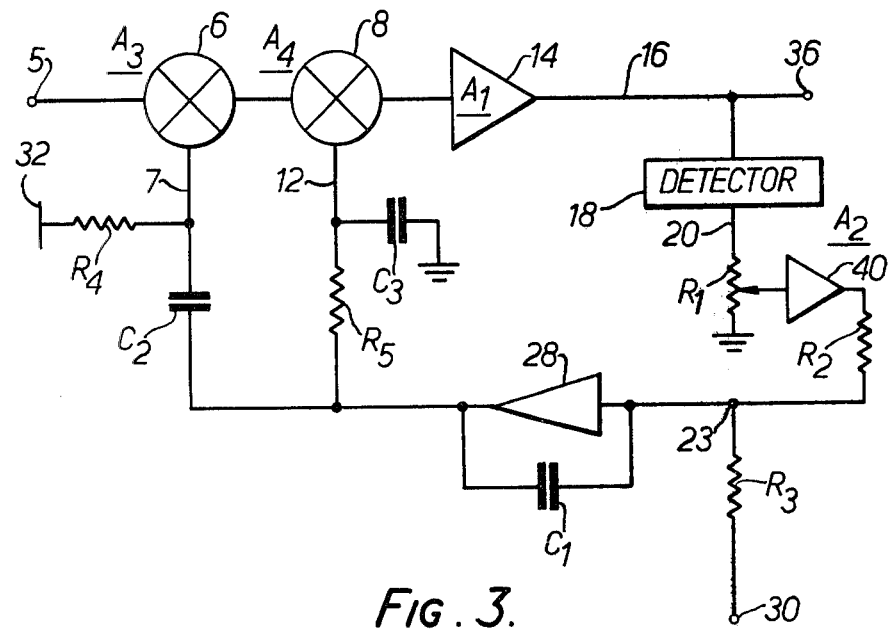
FIG. 3 is a circuit diagram of another of the AGC circuit arrangements.

FIG. 3 shows the circuit arrangement of FIG. 1 modified in order to ensure that $A_2$ is inversely proportional to $V_o$. In the circuit of FIG. 3, the output of detector 18 is now fed through a resistor $R_1$ to ground, and an adjustable tapping on this resistor is fed through a buffer amplifier 40 to the resistor $R_2$. In this circuit, therefore, the gain $A_2$ now becomes the overall gain of the sub-circuit comprising the detector 18, the resistor $R_1$ and the buffer amplifier 40. In operation, the reference $V_r$ is held constant (even when it is desired to vary $V_o$), and in order to change $V_o$, adjustments are made to the position of the tapping on the resistor $R_1$ so as to alter the value of $A_2$. Thus, a reduction in $A_2$ increases $V_o$ by producing a resultant increase in $A_4$ (via the control signal $V_{c2}$).

Therefore, with the circuit arrangement of FIG. 3, $\omega_2$ remains substantially constant for all values of $V_o$ (as well as for changes in the value of $A_1$ and $V_i$).

In the circuit arrangements shown in FIGS. 1 and 3, a problem can arise at very low modulation frequency. Under these conditions, the impedance in the path for the signal $V_{c1}$ becomes significant and $v_{c1}$ tends to zero and the signal $V_{c2}$ becomes effectively equal to $V_c$. Therefore, the modulator 8 must be capable of applying all the necessary modulation. For high levels of pulse modulation at these low frequencies, modulator 8 becomes overloaded and ineffective principally because the circuit limits the rate at which $V_{c2}$ can increase by charging capacitor $C_3$.

Figure 4:
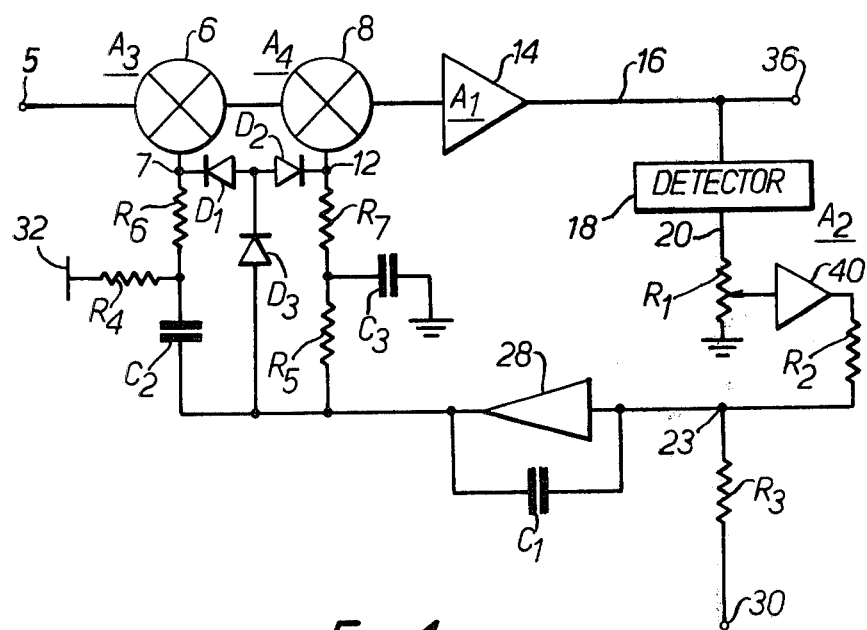
FIG. 4 is a circuit diagram of a further one of the AGC circuit arrangements.

FIG. 4 shows a modification to the circuit arrangement of FIG. 3 (but which can also be applied to the circuit arrangement of FIG. 1) in order to deal with this problem. The modification consists in the provision of by-pass circuits in series with the control inputs of the modulators 6 and 8, together with two additional resistors $R_6$, $R_7$. The by-pass circuits are provided by diodes $D_1$, $D_2$ and $D_3$. Diode $D_3$ is connected to the junction between the $D_1$ and $D_2$ which are respectively directly connected to the inputs of the modulators 6 and 8.

Normally, all these diodes are non-conducting.

However, at very low frequencies where $C_3$ prevents $V_{c2}$ from changing sufficiently rapidly, the diodes $D_2$ and $D_3$ conduct therefore bypassing the effect of capacitor $C_3$.

The mathematical analysis given above is in simplified form because it ignores the interaction between the modulators at the crossover frequency (i.e. the frequency where one modulator ceases to be effective and the other begins to become effective). However, this does not have any practical affect on the analysis at other frequencies and does not affect the constancy which the circuit arrangement gives to $\omega_2$ as explained above.

What is claimed is:

1. An automatic gain control circuit arrangement for producing an output signal which is dependent on an input signal and whose mean level has a desired value, comprising means defining a signal path having an input for receiving the input signal and an output at which is produced the output signal, the signal path including control means controllable to vary the level of the signal in the signal path and amplifying means for amplifying the signal in the signal path, and detecting means connected to sense the level of the signal in the signal path after its level has been varied by the control means and amplified by the amplifying means, and operative in response to variations of the sensed level from the desired value to produce a control signal dependent on the variations and which adjusts the control means in a sense such that it offsets the said variations, the control means comprising one part primarily responsive to the alternating component of the control signal and another part primarily responsive to the D.C. components of the control signal whereby changes in the gain of the amplifying means or in the level of the input signal which tend to alter the upper limit of the loop bandwidth of the circuit arrangement are substantially offset by the effect of the resultant change in the gain of the said other part of the control means.

2. A circuit arrangement according to claim 1, in which
one said part of the control means comprises first modulating means, having a control input for receiving the control signal via a first circuit path, the first circuit path including impedance means which decreases in impedance value with frequency, and
the other said part of the control means comprises second modulating means having a control input for receiving the control signal via a second circuit path, the second circuit path including impedance means which increases in impedance value with frequency.

3. A circuit arrangement according to claim 2, including bypass circuits respectively connected to bypass the said circuit paths of the first and second modulating means at very low frequencies.

4. A circuit arrangement according to claim 1, in which the detecting means comrises
a detector connected to sense the level of the signal in the signal path after its level has been varied by the control means and amplified by the amplifying means,
means producing a reference signal,
means connected to compare that level with the level of the reference signal whereby to produce the said control signal, and
means for adjusting the level of the reference signal whereby to adjust the desired value of the mean level of the output signal.

5. A circuit arrangement according to claim 1, in which the detecting means comprises
a detector having adjustable gain and connected to respond to the level of the signal in the signal path after its level has been varied by the control means and amplified by the amplifying means and operative to produce an output dependent on this level and on its said adjustable gain,
means producing a reference signal,
means for comparing this output with the reference signal whereby to produce the said control signal, and
means for adjusting the gain of the detector whereby to adjust the desired value of the mean level of the output signal.

6. A circuit arrangement according to claim 1, including integrating means connected to apply the control signal to the control means.

7. An automatic gain control circuit arrangement, comprising
means for receiving an input signal,
first modulating means connected to modulate the level of the input signal,
second modulating means connected to modulate the output of the first modulating means,
an amplifier amplifying the output of the second modulating means and for applying it to an output terminal,
a detector detecting the level of the output of the amplifier,
means producing a reference dependent on a desired value of the mean level of the signal produced at the output terminal,
means operative to compare the detected level with the reference whereby to produce a control signal dependent on the difference between the actual level of the output of the amplifier and the said desired value, and
first and second frequency-dependent impedance paths for applying the control signal to the first and second modulating means respectively,
one impedance path having an impedance which decreases with increasing frequency and the other impedance path having an impedance which increases with increasing frequency,
whereby one modulating means performs modulation primarily dependent on the value of the alternating component of the control signal and the other modulating means performs modulation primarily dependent on the D.C. component of the control signal, so that the upper limit of the bandwidth of the circuit arrangement is substantially unaffected by changes in the gain of the amplifier or in the mean level of the input signal.

* * * * *

UNITED STATES PATENT AND TRADEMARK OFFICE
CERTIFICATE OF CORRECTION

PATENT NO. : 4,307,348
DATED : December 22, 1981
INVENTOR(S) : Robert D. Nicholson It is certified that error appears in the above—identified patent and that said Letters Patent is hereby corrected as shown below:

Please amend the Patent to read as follows:

Column 3, line 39, delete "$K_1 \cdot V_1 \cdot V_{c1}$" and insert

-- $K_1 \cdot V_1 \cdot V_{c1}$ --.

Column 6, line 64, delete "components" and insert

-- component --.

Signed and Sealed this

Thirtieth Day of March 1982

[SEAL]

Attest:

*Attesting Officer*

GERALD J. MOSSINGHOFF

*Commissioner of Patents and Trademarks*